United States Patent
Yeung et al.

(10) Patent No.: US 10,256,168 B2
(45) Date of Patent: Apr. 9, 2019

(54) SEMICONDUCTOR DEVICE AND LEAD FRAME THEREFOR

(71) Applicant: Nexperia B.V., AB Nijmegen (NL)

(72) Inventors: Shun Tik Yeung, Hong Kong (HK); Pompeo V. Umali, Hong Kong (HK); Chi Ho Leung, Hong Kong (HK); Kan Wae Lam, Hong Kong (HK); Hans-Juergen Funke, Hamburg (DE); Shu-Ming Yip, Hong Kong (HK)

(73) Assignee: Nexperia B.V., Nijmegen (NL)

( * ) Notice: Subject to any disclaimer, the term of this patent is extended or adjusted under 35 U.S.C. 154(b) by 178 days.

(21) Appl. No.: 15/180,072

(22) Filed: Jun. 12, 2016

(65) Prior Publication Data

US 2017/0358514 A1     Dec. 14, 2017

(51) Int. Cl.
| | |
|---|---|
| *H01L 23/367* | (2006.01) |
| *H01L 23/373* | (2006.01) |
| *H05K 1/02* | (2006.01) |
| *H05K 7/10* | (2006.01) |
| *H05K 7/20* | (2006.01) |
| *H01L 23/495* | (2006.01) |
| *H01L 23/00* | (2006.01) |

(52) U.S. Cl.
CPC .......... *H01L 23/367* (2013.01); *H01L 23/373* (2013.01); *H01L 23/49562* (2013.01); *H01L 24/00* (2013.01); *H05K 1/0204* (2013.01); *H05K 1/0207* (2013.01); *H05K 1/0209* (2013.01); *H05K 7/10* (2013.01); *H05K 7/209* (2013.01)

(58) Field of Classification Search
None
See application file for complete search history.

(56) References Cited

U.S. PATENT DOCUMENTS

| 6,262,489 B1 | 7/2001 | Koors et al. | |
| 6,646,329 B2 * | 11/2003 | Estacio | ............ H01L 23/49558 |
| | | | 257/666 |

(Continued)

FOREIGN PATENT DOCUMENTS

| EP | 2421032 A1 | 2/2012 |
| JP | 2001203301 A | 7/2001 |

(Continued)

*Primary Examiner* — Michael Lebentritt
*Assistant Examiner* — Jordan M Klein
(74) *Attorney, Agent, or Firm* — Ohlandt, Greeley, Ruggiero & Perle, L.L.P.

(57) ABSTRACT

A semiconductor device includes a semiconductor die having a first side having a first terminal and an opposite second side having at least two second terminals. A lead frame has a first part and a second part. The second part of the lead frame is both electrically and mechanically spaced from the first part. The second side of the die is attached to the lead frame such that the first and second lead frame parts are respectively connected to the at least two second terminals. The first and second lead frame parts include respective first and second extensions that project past a side of the die and provide first and second terminal surfaces that are co-planar with the first terminal on the first side of the die. The device makes use of the terminals on the both sides of the die. The device second side is exposed for thermal performance.

19 Claims, 8 Drawing Sheets

(56) References Cited

U.S. PATENT DOCUMENTS

| | | | | |
|---|---|---|---|---|
| 7,166,496 | B1* | 1/2007 | Lopez | H01L 21/561 |
| | | | | 257/E23.044 |
| 7,944,031 | B2 | 5/2011 | Galera et al. | |
| 8,163,601 | B2* | 4/2012 | Gong | H01L 21/568 |
| | | | | 257/E21.499 |
| 8,436,429 | B2* | 5/2013 | Xue | H01L 23/49524 |
| | | | | 257/401 |
| 8,531,016 | B2 | 9/2013 | Cho | |
| 2001/0048116 | A1 | 12/2001 | Standing et al. | |
| 2002/0008319 | A1 | 1/2002 | Davis et al. | |
| 2002/0179994 | A1* | 12/2002 | Chen | H01L 23/3114 |
| | | | | 257/500 |
| 2003/0016505 | A1 | 1/2003 | Jauregui | |
| 2003/0075786 | A1 | 4/2003 | Joshi et al. | |
| 2003/0122247 | A1 | 7/2003 | Joshi | |
| 2004/0061221 | A1 | 4/2004 | Schaffer | |
| 2004/0063240 | A1* | 4/2004 | Madrid | H01L 23/49524 |
| | | | | 438/106 |
| 2004/0159939 | A1 | 8/2004 | Joshi | |
| 2004/0183196 | A1 | 9/2004 | Yang et al. | |
| 2004/0266037 | A1 | 12/2004 | Knapp et al. | |
| 2005/0029666 | A1 | 2/2005 | Kurihara et al. | |
| 2006/0060891 | A1 | 3/2006 | Pavier | |
| 2006/0197187 | A1 | 9/2006 | Lohninger et al. | |
| 2007/0278550 | A1 | 12/2007 | Asai et al. | |
| 2008/0296760 | A1 | 12/2008 | Nogi et al. | |
| 2009/0057855 | A1* | 3/2009 | Quinones | H01L 23/49551 |
| | | | | 257/676 |
| 2009/0194856 | A1 | 8/2009 | Gomez | |
| 2010/0044885 | A1* | 2/2010 | Fuergut | H01L 21/561 |
| | | | | 257/784 |
| 2010/0127365 | A1 | 5/2010 | Galera et al. | |
| 2010/0133666 | A1 | 6/2010 | Meyer-Berg et al. | |
| 2010/0308454 | A1 | 12/2010 | Lu et al. | |
| 2011/0101511 | A1 | 5/2011 | Lu et al. | |
| 2012/0286410 | A1 | 11/2012 | Groehhuis et al. | |
| 2013/0320551 | A1 | 12/2013 | Boettcher et al. | |
| 2015/0162270 | A1* | 6/2015 | Ashrafzadeh | H01L 24/97 |
| | | | | 257/666 |

FOREIGN PATENT DOCUMENTS

| | | |
|---|---|---|
| JP | 200551267 | 2/2005 |
| JP | 3730469 B2 | 1/2006 |

* cited by examiner

SEMICONDUCTOR DEVICE AND LEAD FRAME THEREFOR

BACKGROUND

The present invention is directed to semiconductor devices and lead frames for semiconductor devices, and more particularly to compact lead frame based semiconductor package.

Power devices, such as power MOSFETs, require high performance thermal capacity and heat dissipation because they are required to drain unwanted large currents to ground or other rails to protect devices connected thereto from being damaged. On the other hand, the power devices face challenges from structural compactness, which requires them to have a very small footprint and package height.

It is an object of the present invention to provide a lead frame based, compact, yet thermally efficient semiconductor package.

SUMMARY OF THE INVENTION

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

In one embodiment, the present invention provides a semiconductor device, comprising a semiconductor die having a first side and an opposite second side, the semiconductor die comprising a first terminal on the first side and at least two second terminals on the second side, and a lead frame. The lead frame comprises first and second base parts that are mutually spaced from each other both electrically and mechanically, wherein the second side of the semiconductor die is mounted to the lead frame such that the at least two second terminals are electrically connected, respectively, to the first and second base parts. The lead frame further comprises first and second protrusions on the first and second base parts that project past a side of the die and provide first and second terminal surfaces that are co-planar with the first terminal on the first side of the semiconductor die.

In another embodiment, the present invention provides a semiconductor device, comprising a semiconductor die having a first terminal on a first side and at least two second terminals on an opposite second side, and a lead frame having first and second parts. Each of the first and second parts comprises a base and a protrusion. The protrusions are respectively connected to and protrude from first sides of the bases. A height of the protrusions is substantially equal to a thickness of the semiconductor die, such that when the semiconductor die is mounted on the lead frame with the second side of the die facing the bases of the first and second parts of the lead frame, then the first side of the die is co-planar with distal ends of the protrusions.

The present invention further provides a lead frame for a semiconductor device. The lead frame comprises a first part including a first branch and a second branch, wherein the second branch is connected to and extends from the first branch. The lead frame also includes a second part having a third branch and a fourth branch, wherein the fourth branch is connected to and extends from the third branch. A first connection bar connects the first branch of the first part to the third branch of the second part of a neighboring lead frame when the lead frame is part of a matrix of lead frames. A second connection bar connects the first branch of the first part to the second and fourth branches respectively of the first and second parts of another neighboring lead frame. The second branch of the first part and the fourth branch of the second part extend in the same direction and to the same height.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. The drawings are for facilitating an understanding of the invention and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
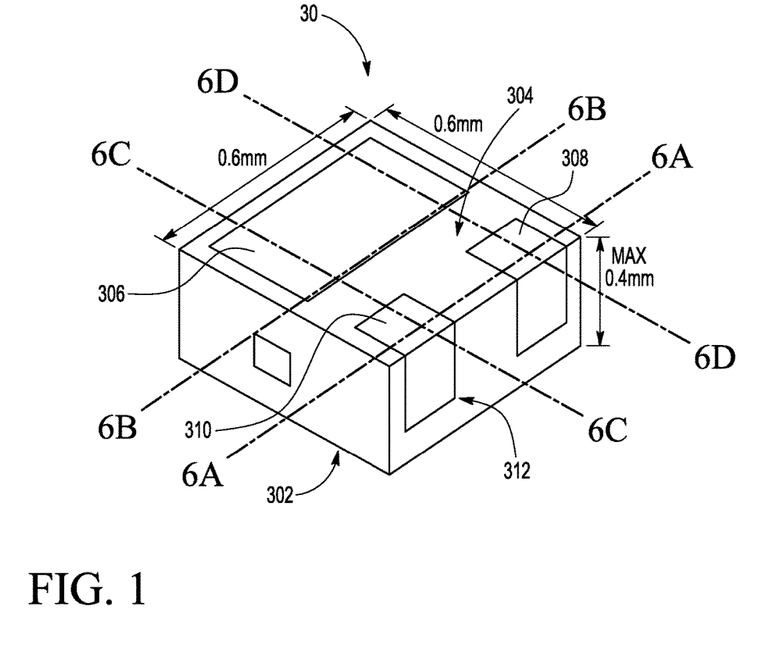
FIG. 1 is a perspective view of a semiconductor device in accordance with an embodiment of the present invention.

FIG. 1 is a perspective view of a semiconductor device 30 in accordance with an embodiment. The semiconductor device 30 has a top surface 302 and an opposing bottom surface 304. On the bottom surface 304, the semiconductor device 304 includes multiple contacts 306, 308, and 310. The contacts 306, 308, and 310 are used for electrically connecting the semiconductor device 30 to external circuit components, such as a printed circuit board (PCB). In the embodiment shown, the first contact 306 is exposed only on the bottom surface 304, while the second and third contacts 308, 310 extend from the bottom surface 304 to a lateral side wall 312 of the semiconductor device 30 where they also are exposed.

The first contact 306 is provided on a conductive surface of a semiconductor die of the semiconductor device 30, while the second and the third contacts 308, 310 are provided by a conductive lead frame to which the die is mounted and electrically connected. In one example embodiment, the semiconductor die is a VDMOS, and the first contact 306 is connected to a drain of the VDMOS, and the second and third contacts 308, 310 are respectively connected to a source and a gate of the VDMOS. The semiconductor device 30 may be square or rectangular in shape, with a side length of 0.6 mm, and a thickness of 0.4 mm. In other embodiments, the semiconductor die can be provided as BJT, thyristor, etc.

Figure 2A:
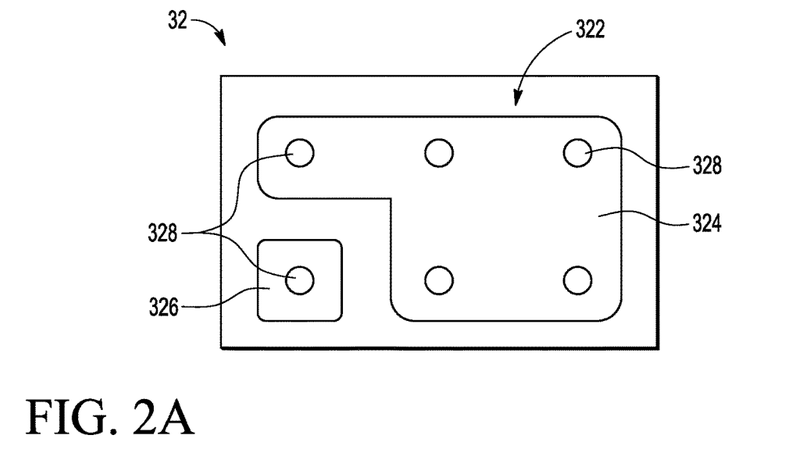
FIG. 2A is a top plan view of a semiconductor die of the device of FIG. 1.
Figure 2B:
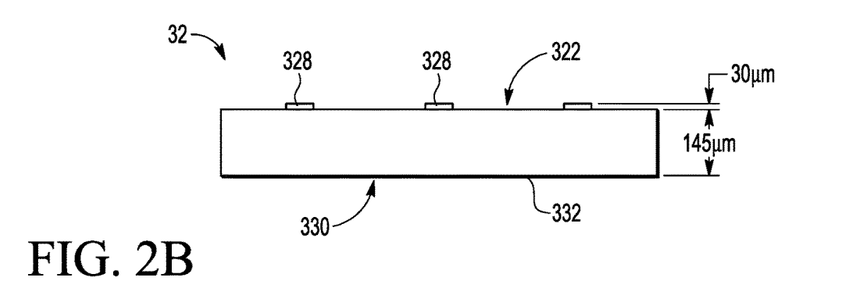
FIG. 2B is side view the semiconductor die of FIG. 2A.

Referring to FIGS. 2A and 2B, a top plan view and a side view of a semiconductor die 32 of the semiconductor device 30 are illustrated. The semiconductor die 32 is generally rectangular shaped. A major portion on a first surface 322 is provided as a first terminal 324, and the other portion on the first surface 322 is provided as a second terminal 326. As discussed below, on an opposite second surface of the semiconductor die 32, a third terminal is provided. When packaged (see FIG. 1), the first and second terminals 324 and 326 provide the contacts 310 and 308, while the third terminal provides the contact 306. The relative proportion of the first terminal 324 and the second terminal 326 is not limited to that illustrated in FIG. 2A. For example, in another embodiment, the second terminal 326 may have an area equal to or larger than that of the first terminal 324. To meet the size specification of example semiconductor device 30, discussed above, a length of the semiconductor die 32 is 0.5 mm, and a width is 0.275 mm.

In one embodiment, studs 328 are disposed on the first surface 322. As illustrated in FIG. 2B, the studs 328 are placed on top of the first surface 322, and with predetermined heights. In compliance with the device thickness as in FIG. 1, the height of the studs 328 can be 30 μm, while the thickness of the semiconductor die 32 can be 145 μm. A left bottom stud serves as the second terminal, while the other studs serve as the first terminal. In the example of a VDMOS, the left bottom stud can be connected to the gate of the VDMOS, while the other studs connected to the source of the VDMOS. It shall be the appreciation of any skilled person that, the studs 328 can have any other suitable arrangements, and can be made of any suitable material, such as Cu. Furthermore, not all the studs are needed to be conductive. As mentioned above, on a second surface 330 of the semiconductor die 32 opposite to the first surface 322, a third terminal 332 is provided, for example made of CuSn. As previously presented, in the example that the semiconductor die 32 is a VDMOS, the third terminal 332 can be connected to the drain thereof. In other available embodiments, the semiconductor die can be provided as BJT, thyristor, etc.

Figure 3:
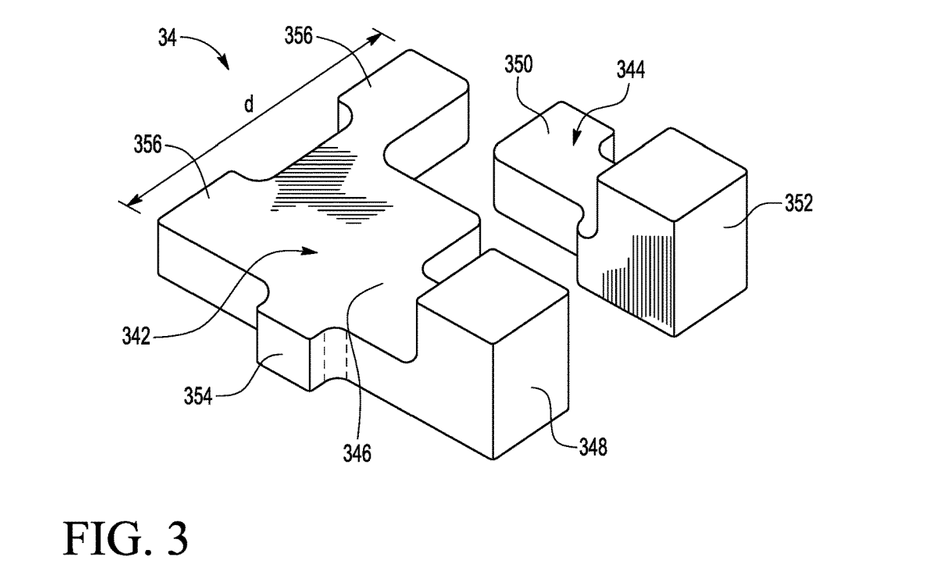
FIG. 3 is a perspective view of a lead frame of the semiconductor device of FIG. 1.

FIG. 3 is a perspective view of a unit of a lead frame matrix in accordance with an exemplary embodiment. The lead frame 34 includes a first part 342 and a second part 344. The first part 342 is distinguished and spaced apart from the second part 344. Each of the first part 342 and the second part 344 includes a first branch and a second branch. The first branch 346 of the first part 342 is substantially flat. The second branch 348 of the first part 342 is connected to an edge of the first branch 346, and extends from the first branch 346 to be substantially perpendicular to the first branch 346. The first branch 350 of the second part 344 is co-planar with the first branch 346 of the first part 342. The second branch 352 is connected to an edge of the first branch 350 in the same direction as that of the edge of the first branch 346 of the first part 342. The second branch 352 extends from the first branch 350 to be substantially perpendicular to the first branch 350. The second branches 348 and 352 protrude from the first branches 346 and 350 in a same direction, and to a similar extent of height. In this way, the second branch 352 of the second part 344 is aligned with the second branch 348 of the first part 342. Preferably, the second branches 348 and 352 have a same height of extension from the respective co-planar first branches 346 and 350.

Each part 342, 344 of the lead frame 34 is thereby provided to be including a base (first branch) and a protrusion (second branch) which connects to the base and protrudes from a first side of the base. The base of the first part 342 and the second base 344 are co-planar, collectively for receiving the semiconductor die 32 to be placed on the first side. A first side of the semiconductor die 32 is placed to face the first side of the first part 342 and the second part 344, while an opposite second side of the semiconductor die 32 is accordant to the ends of the protrusions.

In assembly, the first part 342 and the second part 344 are respectively used for receiving and connecting to the first terminal 324 and the second terminal 326 of the semiconductor die 32. In which situation, the space between the first part 342 and the second part 344, as well as the sizes of the first part 342 and the second part 344, are adapted to be, in total, substantially similar to the size of the semiconductor die 32. Specifically, a width d from an edge of the first part 342 to an opposite edge of the second part 344 is generally equal to the width of the semiconductor die.

With reference to FIG. 2A and FIG. 2B, in assembly, the first surface 322 of the semiconductor die 32 is placed facing the lead frame 34. The studs 328 of the first terminal 324 are connected to the first part 342, in particular, to the first branch 346 of the first part 342. The stud 328 of the second terminal 326 is connected to the second part 344, in particular, to the first branch 350 of the second part 344. For providing a corresponding space for receiving the first terminal 324 and the second terminal 326, the proportion between the first branch 346 of the first part 342 and the first branch 350 of the second part 344 is approximated to that between the first terminal 324 and the second terminal 326 of the semiconductor die 32. Furthermore, the area of the first branch 346 of the first part 342 is at least as large as the area of the first terminal 324. Similarly, the area of the first branch 350 of the second part 344 is at least as large as the area of the second terminal 326.

It can hereby be understood that, the arrangement of the first branches 346, 350 can be adapted to be correspondent to the arrangement of the first terminal 324 and the second terminal 326. Since the connections to the first and second terminals 324, 326 are guided to the second branches 348, 352, the footprint of the final package can be kept uniform for variable forms of semiconductor dies 32 by making necessary adaptions to the lead frame 34. The embodiment makes it possible to harmonize the compatibility between the package device and the PCB. For example, the PCB, especially the soldering pads for receiving and connecting to the package device, may not be necessarily modified in the situation that the first and second terminals of the semiconductor die are changed.

The extent that the second branches 348, 352 protrude from the first branches 346, 350 can be such that, after the semiconductor die 32 is mounted/packaged onto the lead frame 34, the second surface 330 is generally co-planar with the distal ends of the second branches 348, 352. In such, the third terminal 332 is able to be in the same plane with electrical extensions of the first and second terminals 324, 326. It can be understood that the lead frame 34 may be provided through known arts, like punching, etching, molding, etc. Each of the second branches 348, 352 preferably protrudes to have a length which is at least twice the thickness of the corresponding branches 346, 350. In an example that the lead frame 34 is made through etching, normally a piece of material is etched for obtaining first branches 346, 350 that are recessed with reference to the second branches 348, 352. The first branches 346, 350 are etched to exceed half of the thickness of the piece of material.

After the semiconductor die 32 and the lead frame 34 are encapsulated and singulated, the third terminal 332 and the distal ends of the protruding second branches 348, 352 are exposed for providing a no-lead package device as shown in FIG. 1. The third terminal 332 is thereby provided as the first contact 306 of the semiconductor device 30, the second branches 348 and 352 are provided as the third and second contacts 310 and 308. Particularly, after the encapsulation, one side of the protrusions of the second branches 348 and 352 are exposed as well. This exposed side, together with the distal end of the second branches 348 and 352, will be provided as the third and second contacts 310 and 308, which extends from the bottom surface 304 of the semiconductor device 30 to a side wall 312 thereof.

Referring still to FIG. 3, unlike the proportional arrangement of the first branches 346, 350 in correspondence with the first terminal 324 and the second terminal 326, the second branches 348 and 352 can be configured to mutually have similar sizes, which may save space required for the semiconductor device 30 to provide the second contact 308 and the third contact 310. The first terminal 324 and the second terminal 326 are electrically introduced along the first part 342 and the second part 344 of the lead frame 34, to be provided through third contact 310 and the second contact 308 for external links. The reliability of the electrical connection to the semiconductor die 32 can be enhanced.

According to an exemplary embodiment, active regions of the semiconductor die 32 are located on the side of the first surface 322, the direct contact between the first surface 322 and the lead frame 34 will be advantageous for effectively dissipating heat generated by the active regions in a quickly and complete manner. This is especially useful for applications in which power peaks are needed to be dissipated. For this the heat capacity as build by the lead frame is of advantage.

Generally, the semiconductor die 32 generates heat during operation, which will increase the temperature within the semiconductor die 32. Considering necessary connections that dissipates the generated heat, the temperature within the die is determined by the heat resistance of the total set-up, including the package and the connected PCB. Transient pulse length is in such a range that the heat diffuses a few hundred microns. Such short pulses like ESD produce only local heating near the active junctions. In ESD applications, cooling with dissipating materials outside the package has limited effect.

The semiconductor die 32 can be placed such that the active part of the die is finally soldered to a board. However, the cooling depends heavily on the board layout and board properties—parameter that depend on technology choices. Consequently, the actual robustness of the die cannot be predicted.

According to an exemplary embodiment, the semiconductor die 32 is placed with the active side towards the lead frame. The cooling and the robustness are comparably better and more predictable. The robustness of the die in the application becomes independent (or at least less dependent) from the board layout and board properties. In such configuration the active side is adjacent to adequate heat dissipation material, allowing as low as possible heat resistance between the active side and the lead frame.

It shall also be mentioned that, FIG. 3 illustrates an exemplary embodiment of the unit of the lead frame with first and second parts 342, 344, but it's not intended to limit the lead frame. In other embodiments, for connecting and receiving semiconductor dies with other layouts, the lead frame alternatively can have only one part, or more parts. Each part includes first and second branches as those in FIG. 3, and allows the active region of the semiconductor die to be placed facing the first branch.

Figure 4A:
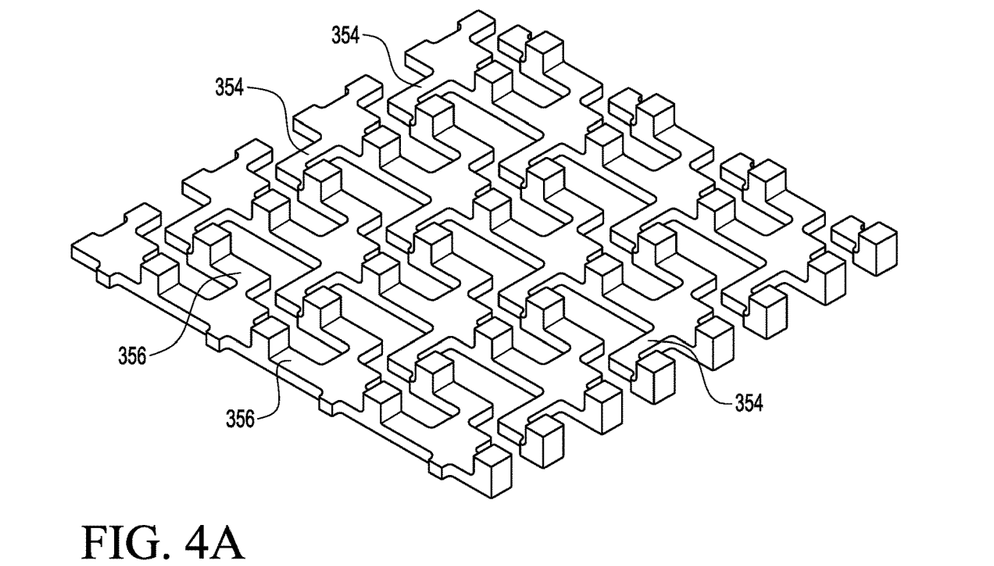
FIGS. 4A-4E are perspective views illustrating steps for assembling the semiconductor device of FIG. 1.
Figure 4B:
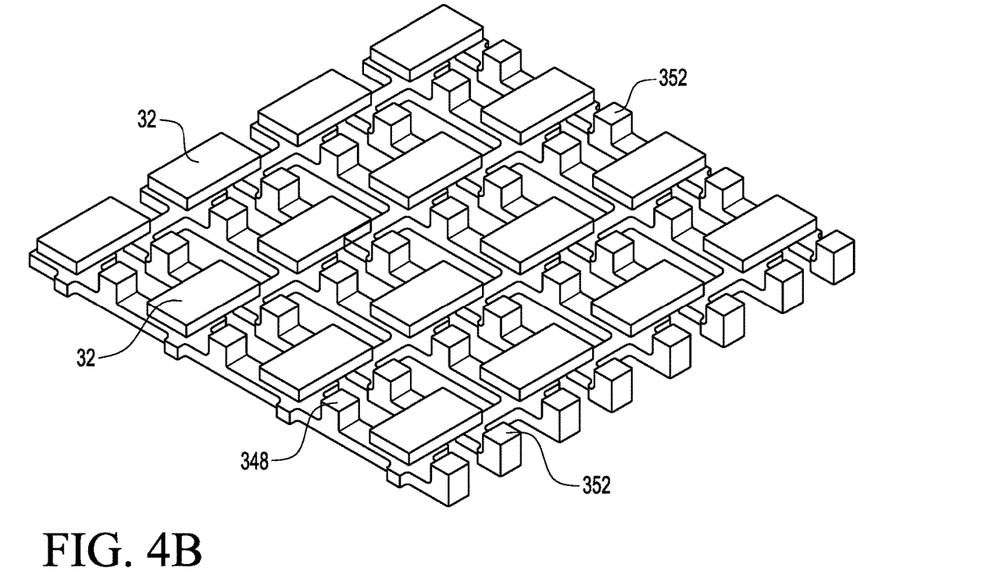

FIG. 4A is a perspective view of multiple lead frames provided in a matrix. As known, the lead frame is manufactured through mass production before the semiconductor dies are applied thereon. In the matrix shown in FIG. 4A, the lead frame units are connected with neighboring lead frame units. The connection between the lead frame units are rigid, so that the first and second parts are with predetermined assembly positions. Since the lead frame as shown in FIG. 3 includes dis-connected first and second parts, the rigid connection in FIG. 4A between each lead frame units can eliminate assembling the first and second parts in place before applying semiconductor dies thereon.

With reference to FIG. 3, the first part 342 of each lead frame unit 34 includes a first connection bar 354 at one side, the first connection bar 354 is used for connecting the first part 342 of the current lead frame unit 34 to the second part of a neighboring lead frame unit. At another side of the first part 342, second connection bars 356 are provided to connect the first part 342 of the current lead frame unit 34 to respectively the first part and the second part of a neighboring lead frame unit. More specifically, the first and second connection bars 354, 356 are provided on the first branch 346 of the first part 342. The first connection bar 354 connects the first branch 346 of the first part 342 of the current lead frame unit 34 and the first branch 350 of the second part of the neighboring lead frame unit. One of the second connection bars 356 connects the first branch 346 of the first part 342 of the current lead frame unit 34 and the second branch of the first part of another neighboring lead frame unit; while another second connection bar 356 connects the first branch 346 of the first part 342 of the current lead frame unit 34 and the second branch of the second part of the another neighboring lead frame unit. The one of the second connection 356 is connected to a sidewall of the second branch of the second part of the neighboring lead frame unit, which sidewall is the side of the protrusion of the second branch to be exposed after the encapsulation and singulation.

Figure 2C:
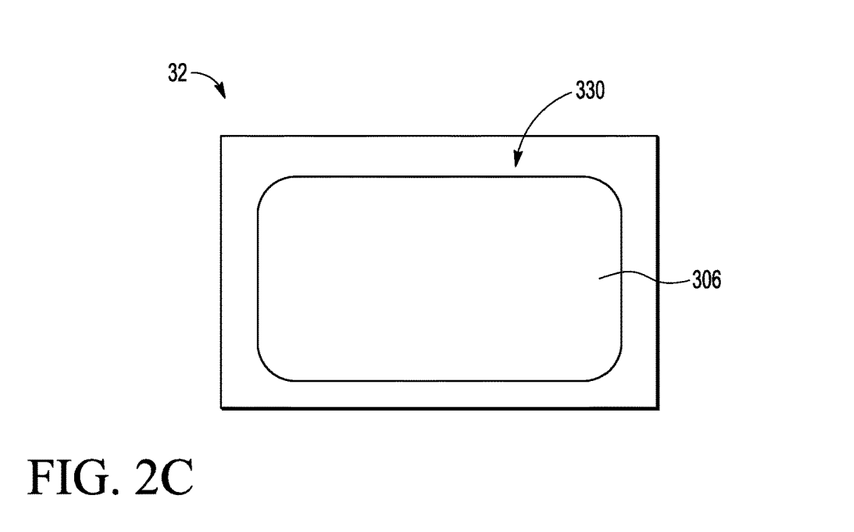
FIG. 2C is a bottom plan view of the semiconductor die of FIG. 2A.

FIG. 4B through FIG. 4E and FIGS. 5A-5C are illustrative views of assemblies during packaging a semiconductor device according to exemplary embodiments. For packaging a semiconductor device, a semiconductor die and a corresponding lead frame are provided. It will be described hereafter with reference to the semiconductor die as shown in FIG. 2A through FIG. 2C, and the lead frame as shown in FIG. 3 and FIG. 4A. The semiconductor die is attached to the lead frame through any suitable connection material, for example solder, glue, or adhesive. In particular applications, the connection material can be selected as conductive material, thereby providing electrical connection between the terminals of the device and the respective parts of the lead frame. The semiconductor die can be applied to the lead frame through various techniques, such as die bonding, etc. See FIG. 4B and with reference to FIG. 2A-2C and FIG. 3, the semiconductor die 32 is placed on the lead frame 34 with its first surface 322 facing the lead frame, and terminals 324, 326 connected to corresponding part of the lead frame respectively. After all semiconductor dies are placed, the assembly might be necessary to go through a reflow process, for soldering the semiconductor dies and the lead frame.

Figure 4C:
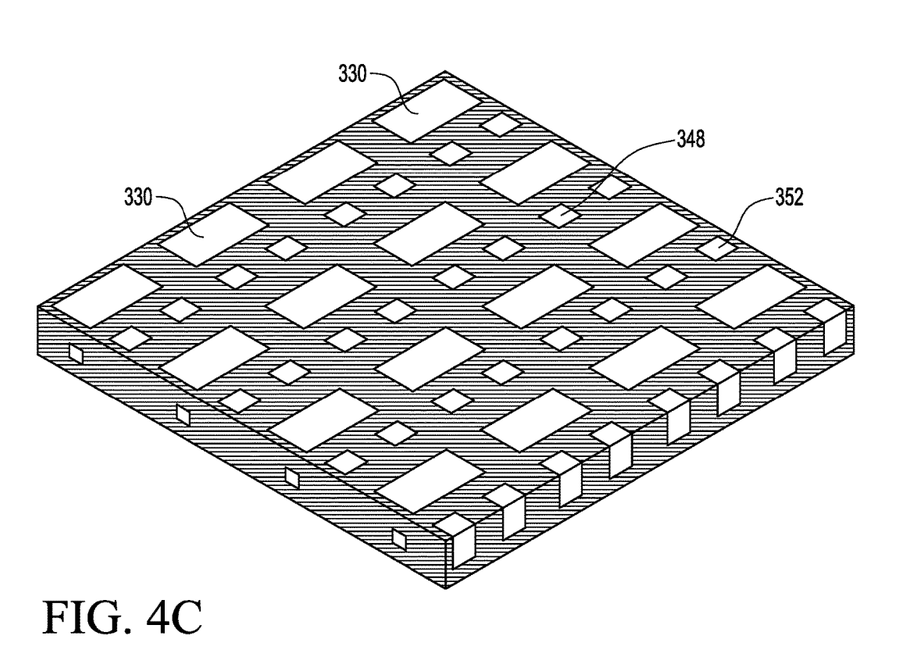

The assembly of the semiconductor dies and the lead frame is molded using various applicable molding compounds, e.g. epoxy. The molded assembly is shown in FIG. 4C. The molding compound may cover the assembly while leaving the second surface 330 and the third terminal 332 of the semiconductor die 32, and the distal ends of the protrusion of the second branches 348, 352 exposed. As described previously, the second surface 330 and the distal ends of the protrusion of the second branches 348, 352 are co-planar.

Figure 4D:
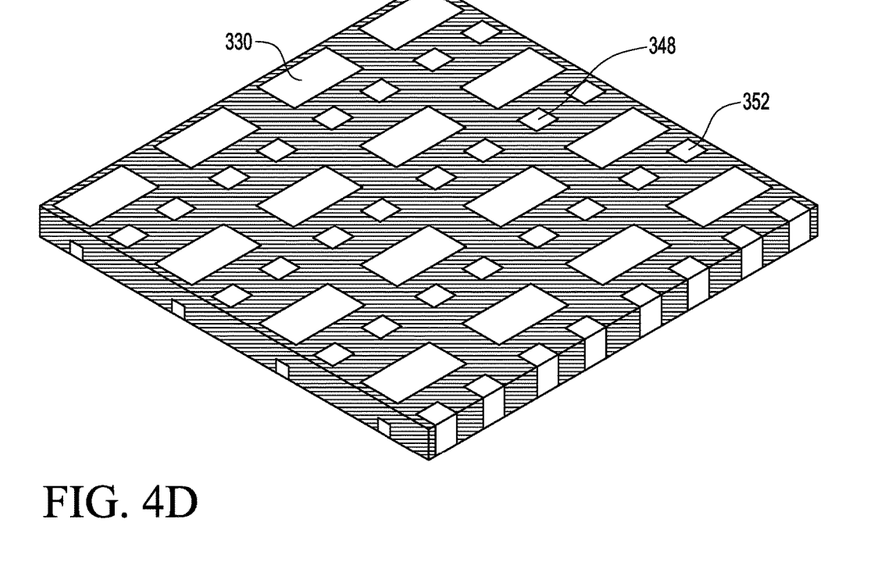
Figure 4E:
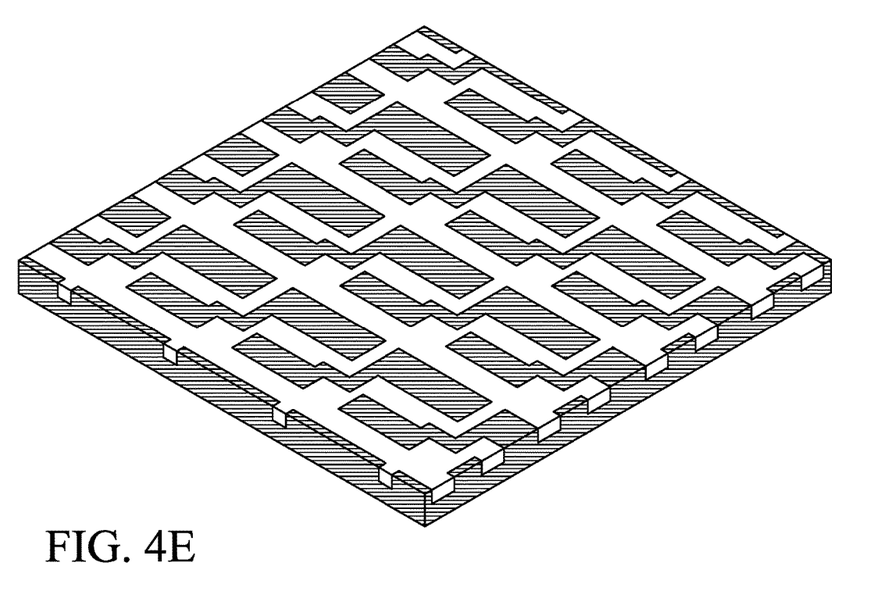

Referring to FIG. 4D and FIG. 4E, according to an optional embodiment, the molded assembly is grinded in the back in order to minimize the overall thickness of the final semiconductor device. As described above, the molding compound may cover the whole assembly, leaving only the second surface 330 and the distal ends of the protrusions exposed. It is thereby possible to remove the molding compound that covers the back of the assembly, i.e. at its side of the lead frame. It can be seen from FIG. 4E and FIG. 4C that, after grinding, a back side of the lead frame which is opposite to the side that the second branches 348, 352 are protruded is exposed. The grinding of the back side can allow the package size to be more compact because the thickness of the obtained semiconductor device is reduced. Furthermore, since the lead frame is exposed both from the front side at the protrusions and from the back side at the bases of the first part and the second part, the heat generated by the semiconductor die, especially when operating under power pulses where transient voltages where heat generation is ultra-high, can be more efficiently conducted and dissipated.

Figure 5A:
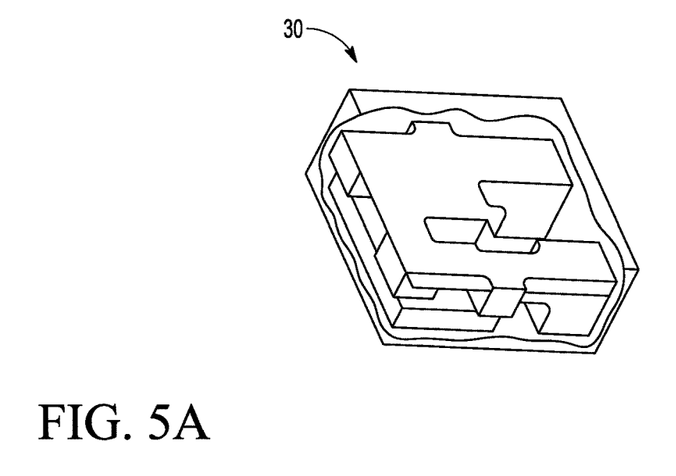
FIG. 5A is a perspective view of an obtained semiconductor device after singulation.

Singulation is followed to cut the molded (and optionally back-grinded) assembly into separate semiconductor device packages. Referring to FIG. 1, and with reference to FIG. 4D and FIG. 4E, singulation is carried along the sidewall of the second branches facing the neighboring lead frame, and along the lane between neighboring lead frames where first connection bars 354 are located. During singulation, the molding compound between neighboring lead frames are removed, and connection bars 354, 356 are cut and removed. FIG. 5A is a perspective view of an obtained semiconductor device after singulation, from another aspect apart from that of FIG. 1.

Figure 5B:
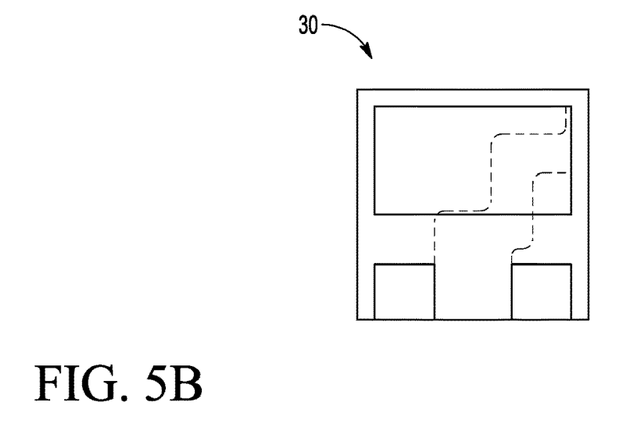
FIG. 5B is a bottom plan view of the semiconductor device of FIG. 5A, seeing from the bottom surface.
Figure 5C:
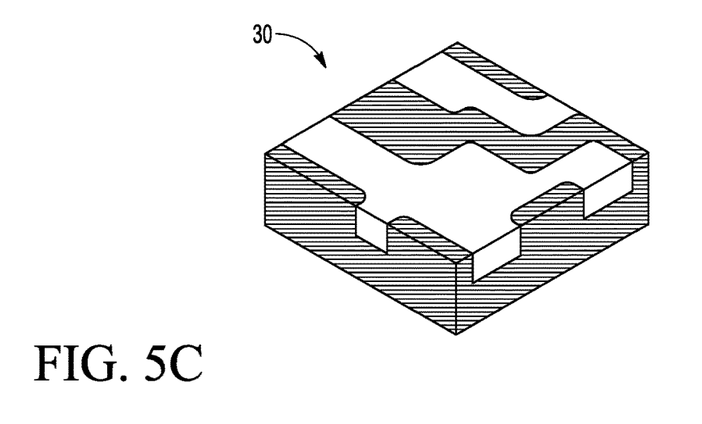
FIG. 5C is a perspective view of an obtained semiconductor device after grinding and singulation.

FIG. 5B is a bottom view of the semiconductor device, seeing from the bottom surface 304 of the semiconductor device 30. The connection bars 354 and 356 are cut away during singulation, leaving sections thereof exposed on the sidewalls of the semiconductor device 30. On the top surface 302 of the semiconductor device 30, the back surface of the base of the lead frame 34 is exposed. In application, when the semiconductor device 30 is mounted to an external circuit, e.g. a PCB, the exposed lead frame will function as additional heat sink for the semiconductor device 30. FIG. 5C is a perspective view of an obtained semiconductor device after grinding and singulation.

Figure 6A:
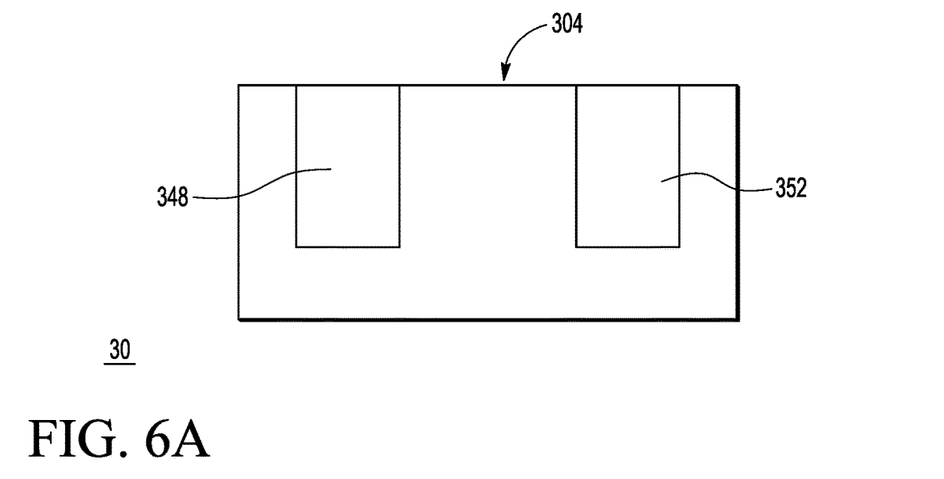
FIG. 6A shows sectional lines on the semiconductor device of FIG. 1.
Figure 6B:
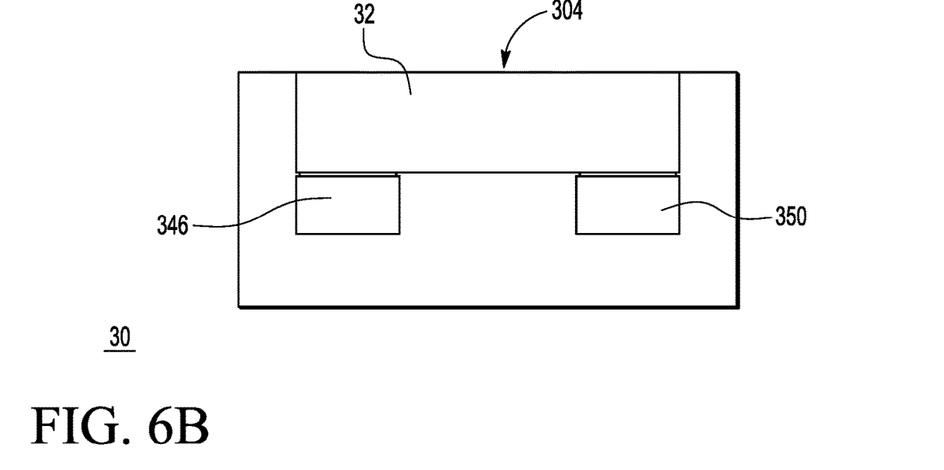
FIGS. 6B-6D are cross-sectional views of the semiconductor device along respective sectional lines of FIG. 6A.
Figure 6C:
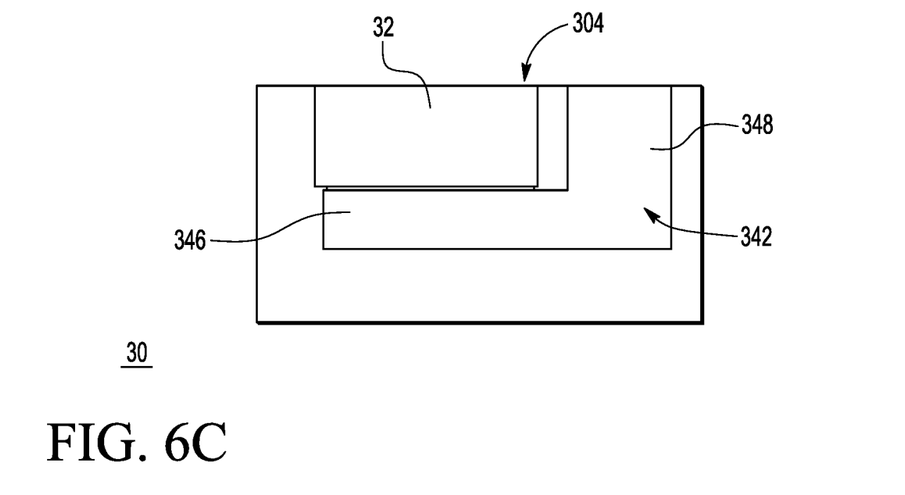
Figure 6D:
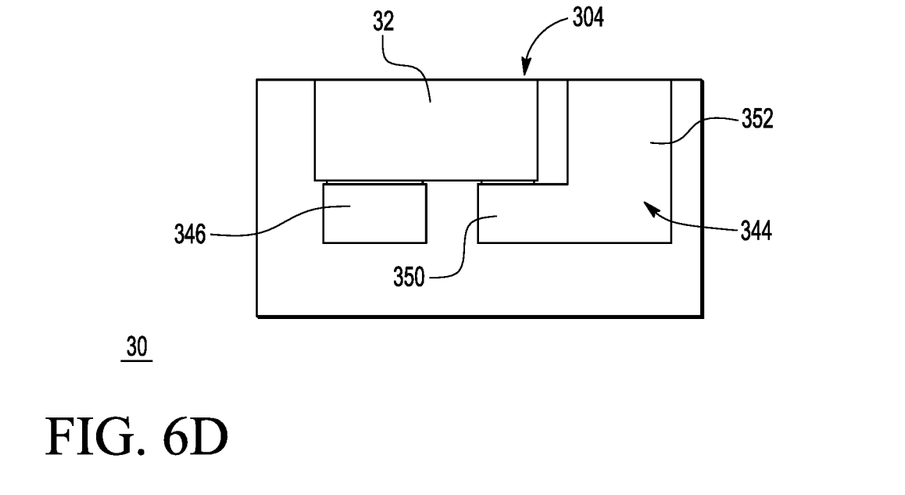

Cross-sectional views of the semiconductor device 30 along the sectional lines as in FIG. 1 are described below with reference to FIG. 6A-6D. See FIG. 6A, second branches 348, 352 are shown. In FIG. 6B, cross-sections of the first branches 346, 350, and the semiconductor die 32 are illustrated. FIG. 6C illustrates the cross-sectional view of the first part 342 of the lead frame 34, and the semiconductor die 32 placing on the lead frame 34, with first branch 346 and second branch 348 of the first part 342 being depicted as well. FIG. 6D shows the cross-sectional view of the first and second branches 350, 352 of the second part 344, the semiconductor die 32, and the first branch 346 of the first part 342.

The semiconductor device and the lead frame allow the semiconductor die to have multiple contacts to be connected, while maintaining a more compact structure with constrained package size and thickness. The terminals at the active region side of the semiconductor die are connected through the lead frame to be co-planar with the terminal at the passive region side, which enables a no-lead package. The exposure of the protrusions on the sidewall of the semiconductor device further allows the semiconductor device to be side wettable during connection with external circuits like a PCB, which can improve the robustness of both mechanical and electrical connections.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A semiconductor device, comprising:
   a semiconductor die having a first side and an opposite second side, the semiconductor die comprising a first terminal on the first side and at least two second terminals on the second side; and
   a lead frame comprising:
   first and second base parts that are electrically and mechanically spaced from each other, wherein the second side of the semiconductor die is mounted to the lead frame so that the at least two second terminals are electrically connected, respectively, to the first and second base parts; and the first base part having only one first protrusion that projects past a side of the semiconductor die and provides a first terminal surface that is co-planar with the first terminal on the first side of the semiconductor die, the second base part having only one second protrusion that projects past a side of the semiconductor die and provides a second terminal surface that is co-planar with the first terminal on the first side of the semiconductor die, wherein the first and second protrusions are substantially the same size.

2. The semiconductor device of claim 1, wherein each of the at least two second terminals include an area, and wherein the areas of the at least two second terminals are different.

3. The semiconductor device of claim 2, wherein each of the first and second base parts of the lead frame have an area corresponding to the area of the respectively connected second terminal.

4. The semiconductor device of claim 1, wherein the semiconductor device has a top surface and a bottom surface, and wherein the first side of the semiconductor die, the first protrusion, and the second protrusion are exposed on the bottom surface.

5. The semiconductor device of claim 4, wherein the first and second base parts of the lead frame respectively have exposed surfaces on the top surface of the semiconductor device.

6. The semiconductor device of claim 5, wherein the first and second protrusions have exposed parts on a lateral side of the semiconductor device.

7. The semiconductor device of claim 1, wherein the first and second protrusions extend perpendicularly from the first and second base parts.

8. The semiconductor device of claim 1, wherein the semiconductor die comprises a VDMOS, a gate of the VDMOS is connected to a first one of the second terminals, a source of the VDMOS is connected to a second one of the second terminals, and a drain of the VDMOS is connected to the first terminal.

9. The semiconductor device of claim 1, further comprising a molding compound that at least partially encapsulates the semiconductor die.

10. A semiconductor device, comprising:
a semiconductor die comprising a first terminal on a first side and at least two second terminals on an opposite second side; and
a lead frame comprising a first part and a second part, each of the first and second parts consisting of a base and a protrusion, wherein the protrusions are respectively connected to and protrude from first sides of the bases, wherein the protrusions have a height that is substantially equal to a thickness of the semiconductor die, so that when the semiconductor die is mounted on the lead frame with the second side of the die facing the bases of the first and second parts of the lead frame, then the first side of the die is co-planar with distal ends of the protrusions, and wherein the protrusions are substantially the same size.

11. The semiconductor device of claim 10, wherein each of the bases of the first part and the second part of the lead frame is connected to a corresponding one of the two second terminals of the semiconductor die.

12. The semiconductor device of claim 10, wherein the distal ends of the protrusions and the first terminal are exposed on a bottom surface of the semiconductor device.

13. The semiconductor device of claim 10, wherein each of the bases of the first and second parts have second sides opposite to the first sides, wherein the second sides are exposed on a top surface of the semiconductor device.

14. The semiconductor device of claim 10, wherein sidewalls of the protrusions are exposed on a lateral sidewall of the semiconductor device.

15. The semiconductor device of claim 10, further comprising a molding compound that at least partially encapsulates the semiconductor die.

16. Lead frames comprising multiple lead frame units arranged in a matrix, wherein each lead frame unit comprises:
a first part consisting of a first branch and a second branch, wherein the second branch is connected to and extends from the first branch;
a second part consisting of a third branch and a fourth branch, wherein the fourth branch is connected to and extends from the third branch;
a first connection bar configured for connecting the first branch of the first part to the third branch of the second part of a neighboring lead frame unit; and
second connection bars configured for connecting the first branch of the first part to the second and fourth branches respectively of the first and second parts of another neighboring lead frame unit,
wherein the second branch of the first part and the fourth branch of the second part are substantially the same size and extend in the same direction and to the same height.

17. The lead frames of claim 16, wherein the first and second connection bars are removable such that the first and second parts of each lead frame unit are electrically and mechanically separable.

18. The lead frames of claim 16, wherein the first branch of the first part has an area that is different from an area of the third branch of the second part.

19. The lead frames of claim 16, wherein the each of the second and fourth branches protrudes perpendicularly from a side of the corresponding first and third branch.

* * * * *